SEMICONDUCTOR DEVICE WITH FLEXIBLE LEAD CONNECTION

Filed July 23, 1964

WITNESSES:
John G. Chopp
James T. Young

INVENTORS
Robert J. Reintgen and
Robert R. Shaw
BY
C. L. Menzemer
ATTORNEY

United States Patent Office 3,294,895

Patented Dec. 27, 1966

3,294,895
SEMICONDUCTOR DEVICE WITH FLEXIBLE LEAD CONNECTION

Robert J. Reintgen, Latrobe, and Robert R. Shaw, Jeannette, Pa., assignors to Westinghouse Electric Corporation, East Pittsburgh, Pa., a corporation of Pennsylvania Filed July 23, 1964, Ser. No. 384,677
3 Claims. (Cl. 174—94)

This invention relates to an improved method for affixing an electrical lead to an electrical contact within a semiconductor device and to the semiconductor device so produced.

An object of this invention is to provide a semiconductor device in which a flexible electrical lead is more securely affixed to an electrical contact than was heretofore possible.

Another object of this invention is to provide a means for strengthening the joint between an electrical contact and a flexible electrical lead in a semiconductor device.

Another object of the present invention is to provide a semiconductor device in which a collar is disposed about the joint between an electrical contact and a flexible electrical lead.

Other objects of the invention will, in part, be obvious and will, in part, appear hereinafter.

For a better understanding of the nature and objects of this invention reference should be had to the following detailed description and drawings, in which.

In accordance with the present invention and attainment of the foregoing objects there is provided in a semiconductor device in which one end of a flexible lead is disposed in a cup-shaped member, and the cup-shaped member is joined to an electrical contact, the improvement comprising, a collar of a material having a higher tensile strength, and a lower coefficient of thermal expansion than the cup material disposed about and crimped to the cup-shaped member.

Figure 1:
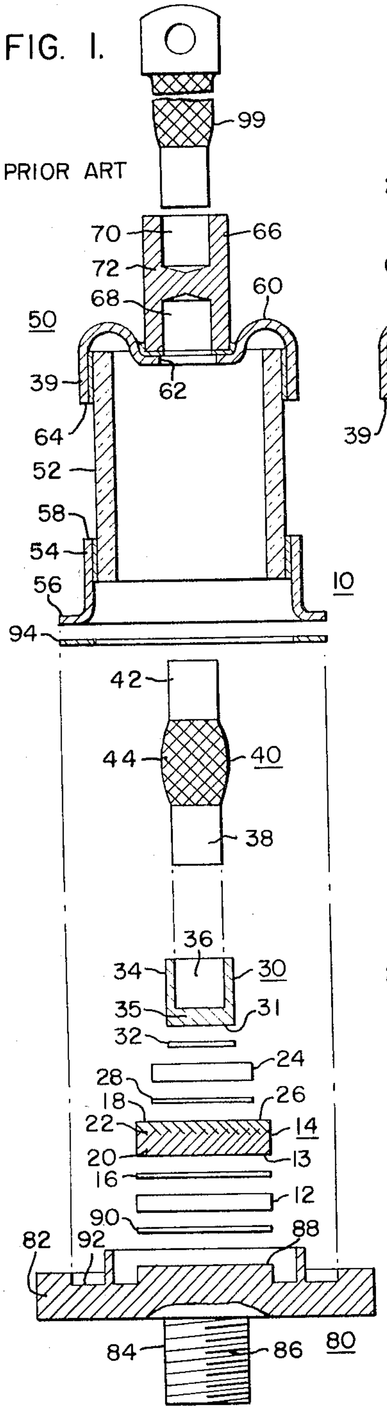
FIGURE 1 is an exploded view, partially in cross-section, of a prior art semiconductor device.

More specifically, and with reference to FIG. 1, there is shown an exploded view of a typical prior art two terminal semiconductor device 10.

The semiconductor device 10 includes a base contact 12, which may comprise any suitable metal such as molybdenum, tungsten, tantalum and base alloys thereof.

The base contact 12 is joined to surface 13 of a single crystal wafer 14 of a semiconductor material by a solder layer 16.

The wafer 14 may be of any suitable semiconductor material such as for example, silicon, germanium, silicon carbide, compounds of elements from Group III and Group V of the Periodic Table, such for example as gallium arsenide, and elements from Group II and Group VI of the Periodic Table such for example as cadmium sulfide.

The wafer 14 has one region 18 of a first semiconductivity and one region 20 of a second type of semiconductivity. There is a semiconductive transition region 22 or junction between regions 18 and 20.

The wafer 14 may be prepared by any of the techniques known to those skilled in the art, and one or both of the regions 18 and 20 may be formed by alloying, diffusion rate growing, melt back, grown diffused or any other technique known to those skilled in the art. The wafer 14 may also be section of a dendrite or a dendritic web section.

The solder layer 16 may be comprised of a so-called hard solder having a melting point above about 372° C. such as silver and gold based alloy solders or a soft solder having a melting point below about 372° C. such as a lead base solder.

Another electrical contact 24 is joined to surface 26 of the wafer 14 by a solder layer 28.

The contact 24 may be comprised of any suitable metal such as molybdenum, tungsten, tantalum and base alloys thereof.

The solder layer 28 may either be a hard solder or a soft solder as described hereinabove relative to solder layer 16.

Solder layers 16 and 28 will usually both be either a hard or a soft solder, but one may be a soft solder and one a hard solder.

A cup-shaped member 30 is joined to the contact 24 along bottom surface 31 of the cup-shaped member 30 by a solder layer 32.

The cup-shaped member 30 and the contact 24 may be one integral piece. The cup-shaped member 30 is an extension of contact 24 and is in itself an electrical contact.

The cup-shaped member 30 is comprised of an electrically conductive metal particularly such as copper, aluminum, silver and base alloys thereof. It may also be comprised of any other good electrically conductive metal.

If the cup-shaped member 30 is integral with contact 24, the one integral piece may be molybdenum, tungsten, tantalum or base alloys thereof or the one integral piece may be of copper, aluminum, silver or base alloys thereof.

Thin walls 34 and a bottom portion 35 of the cup-shaped member 30 form a recess 36 in the cup-shaped member 30.

End portion 38 of a flexible electrical lead 40 is disposed within recess 36 of the cup-shaped member 30. The walls 34 of the cup-shaped member 30 are crimped to hold end 38 of flexible lead 40 within the recess 36 and preferably in contact with bottom portion 35 of the cup-shaped member 30.

The flexible lead 40 is comprised of end portion 38, end portion 42 and a center portion 44. The two end portions 38 and 42 are usually of solid metal. The center portion 44 consists of metal braid or strap. The flexible metal lead 40 may be comprised of any electrically conductive metal such as copper, aluminum, silver base alloys thereof and the like.

The flexible lead 40 may be, and usually is, of the same metal or alloy as cup-shaped member 30. If they are not of the same metal or alloy they should be of metals or alloys which have approximately the same coefficient of thermal expansion over the operating temperature range of the semiconductor device.

The semiconductor device is then enclosed in a case.

The typical case is usually comprised of two parts, a cap 50 and a base 80.

The cap 50 comprises an open-ended cylindrical ceramic member 52. A metallic annular member 54 having a laterally extending flange 56 at the lower end thereof is hermetically joined to the exterior of the lower end of the ceramic member by means of a solder 58. The solder 58 may be a soft or hard solder. The annular member 54 may consist of a metal such as copper, silver, aluminum, base alloys thereof and ferrous alloys. A top member 60, which may be comprised of one of the same metals as the annular member 54, having a central aperture 62 and a downward extending skirt 39 is soldered by solder 64 to the exterior of the upper end of the ceramic cylinder 52. A terminal member 66 extends upwardly from the top member 60. The terminal member 66 has a swageable inner dead-end counterbore 68 in alignment with an opening to the aperture 62 and a swageable outer dead-end counterbore 70 opening to the exterior. A closure 72 separates counterbores 68 and 70.

The terminal member 66 may be comprised of a metal such as copper, aluminum, silver and base alloys thereof.

The base 80 comprised of a suitable metal as for example copper, aluminum, base alloys thereof and ferrous base alloys has a top portion 82 and a stud portion 84.

The stud portion 84 may have screw threads 86 disposed over at least a portion of its length.

The top portion 82 of the base 80 has a flat portion 88, which may be a pedestal as shown in FIG. 1, and to which the semiconductor device 10 is joined by soldering contact 12 to the flat portion 88 with solder layer 90.

The solder layer 90 may be a soft or hard solder as defined hereinabove.

A groove 92 is disposed on the top portion 82 of the base 80.

The groove 92 is of such a width as to enable it to accommodate a solder ring 94 which is used to solder flange 56 of the cap 50 to the base 80 and thus join the cap to the base.

The solder 94 may be either a hard or a soft solder as defined above.

In joining the cap 50 to the base 80, end 42 of the flexible lead 40 is disposed within counterbore 68 of the header 50.

An external electrical lead 99, shown as a flexible lead in FIG. 1 is disposed within counterbore 70.

The device is suitable for use in electronic circuits.

The encased semiconductor device of FIG. 1 is typical of the devices available on the commercial market today from any number of manufacturers and is widely used. The particular design shown will handle up to about 240 amperes of current without difficulty.

However, a problem which has long perplexed both manufacturers and users of such devices is the low tensile strength and thermal fatigue of the joint effected by crimping end 38 of flexible lead 40 in the cup-shaped member 30. This problem has become particularly acute as the current rating of devices is increased to, for examples 275 amperes. With an increase in current capacity it has been found necessary to increase the thickness of the flexible lead 40 and especially end 38 thereof. This of course also requires an increase in the cross-sectional area of recess 36. As an example, applicant has found that to increase the current capacity of a device of the type shown in FIG. 1 from 240 amperes to 275 amperes, it was necessary to increase the cross-sectional area of end 38 of lead 40 from 30,000 circular mils to 66,500 circular mils.

Tests have shown that the joint effected by crimping has a tensile strength of about 4,000 pounds per square inch in a device of 240 amperes capacity when the cup-shaped member 30 is copper. The problem of a strong joint increases when the capacity of the device requires the use of heavy flexible contacts but the wall thickness of the cup-shaped member is limited by the space within the cap and the shear force that operates to tear the cup-shaped member 30 from the contact 24 at solder layer 32.

The discovery has now been made, that by disposing a collar, of a material having a higher tensile strength, and a lower coefficient of thermal expansion than the cup-shaped member, about the walls of the cup-shaped member and crimping both the collar and the walls of the cup-shaped member about the end of the flexible lead disposed within the cup-shaped member, the strength of the joint between the flexible lead and the cup-shaped member is increased by a factor of ten or more.

Figure 2:
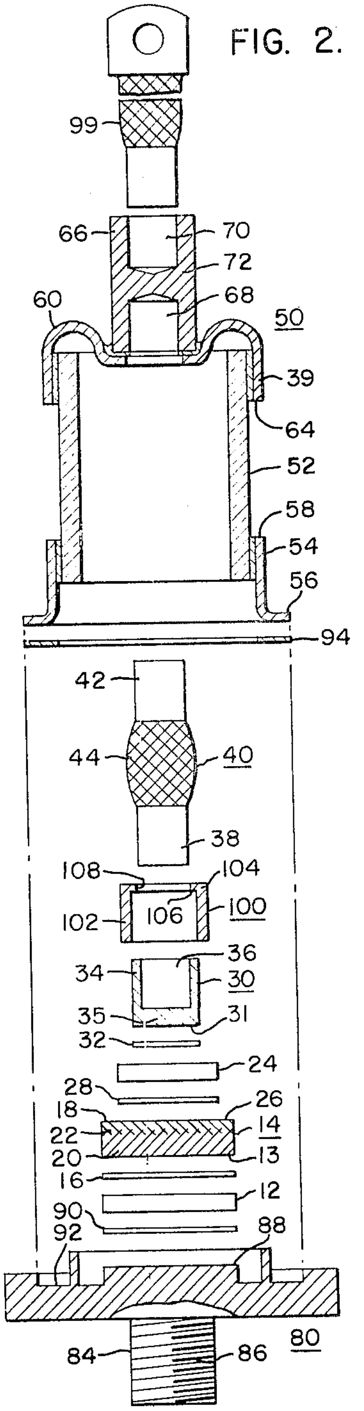
FIG. 2 is an exploded view, partially in cross-section, of a semiconductor device embodying the teachings of this invention.

With reference to FIG. 2, there is shown the device of FIG. 1, and all comparable components have the same reference number, modified by the addition of the teachings of this invention.

Specifically, an annular collar 100 is disposed about the walls 34 of the cup-shaped member 30.

The annular collar 100 has side walls 102 and a top portion 104. There is a shoulder 106 at the intersection of the side walls 102 and the top portion 104. The shoulder 106 rests on side walls 34 of the cup-shaped member 30. There is an aperture 108 in the top portion 104 of the annular collar 100 through which the end 38 of the flexible lead 40 passes.

The annular collar 100 and the cup-shaped member 30 are both crimped about end 38 of the flexible lead 40.

Figure 3:
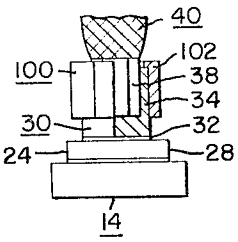

With reference to FIG. 3, there is shown end 38 of flexible lead securely held within the cup-shaped member 30 by the crimped walls 34 of the cup-shaped member and the crimped walls 102 of the annular collar 100.

It should be understood that while the annular collar 100 has been shown held in contact with the cup-shaped member 30 by resting on a shoulder 106, the collar may be held in place about the cup-shaped member 30 by brazing, soldering, heat sweating and any other suitable manner known to those skilled in the art.

It should be further understood that as shown in U.S. Patents 2,763,822 and 2,801,375 contact 24 and cup-shaped member 30 may be formed from one piece of metal.

The teachings of this invention may also be used to reinforce the joint between an external flexible lead and the cap.

Figure 4:
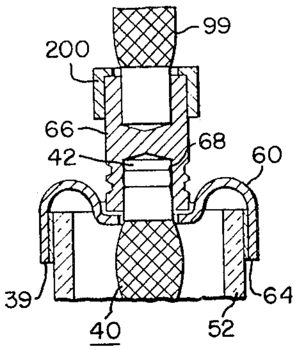
FIGS. 3 and 4 are fragmentary views, partially in cross-section, of a flexible lead disposed within a cup-shaped member and having a collar disposed about the cup-shaped member.

With reference to FIG. 4, there is shown the flexible lead 99 held within the counterbore 70 by a crimped collar 200.

The material employed for the collar must be one which has a higher tensile strength, and a lower coefficient of thermal expansion over the temperature range at which the semiconductor device will operate, than the material comprising the cup-shaped member.

Examples of suitable materials of which the collar may be comprised include low alloy steels, high carbon heat treated steels, stainless steels, when relatively poor thermal conductivity can be tolerated, and when the cup is of copper, silver, aluminum or base alloys thereof, molybdenum, tungsten and tantalum.

The improvement resulting from this invention can be fully appreciated by considering the following facts.

To increase the current capacity of the device shown in FIG. 1 from 240 amperes to 275 amperes, all other electrical parameters remaining constant, it was found necessary to increase the cross-sectional area of end 38 of flexible lead 40 from 30,000 circular mils to 66,500 circular mils.

It was found that to effect the same joint strength between the flexible lead end 38 and the cup 30, both the lead end 38 and cup 30 being of copper, in the 275 ampere device as in the 240 ampere device would require the walls 34 of the copper cup 30 to be 0.375 inch thick. Such an enlargement would greatly increase the size of the header, increase heat dissipation problems and increase the probability of shearing at the solder joint between the cup 30 and contact 24.

However, by following the teachings of this invention, it was found possible in making a device of 275 ampere capacity to use a copper cup having a wall thickness of only 0.029 inch and a collar, of the type shown in FIG. 2 having a side wall thickness of only 0.030 inch to effect a joint having comparable strength to the 240 ampere device.

The collar was made of a steel having the following composition in weight percent:

| | |
|---|---|
| Fe | About 98.20–97.47 |
| C | 0.25–0.35 |
| Mn | 0.60–0.90 |
| Cr | 0.80–1.10 |
| V | 0.15–0.18 |

and small amounts of silicon, phosphorus and sulfur.

Equally satisfactory results can be obtained with other low alloy steels, high carbon steels, especially heat treated high carbon steels, molybdenum, tungsten and tantalum.

While the invention has been described with reference to particular embodiments and examples, it will be understood, of course, that modifications, substitutions and the like may be made therein without departing from its scope.

We claim as our invention:

1. In a semiconductor device in which one end of a flexible electrical lead is disposed in a cup-shaped electrical contact member of a given material, the improvement comprising; a collar of a material having a higher tensile strength, and a lower coefficient of thermal expansion than the given material disposed about the cup-shaped member, and both the collar and cup-shaped member being crimped about that end of the flexible lead disposed within the cup-shaped member.

2. In a semiconductor device in which one end of a flexible lead is disposed within a cup-shaped member of a given material and the cup-shaped member is joined to an electrical contact, the improvement comprising, a collar of a material having a higher tensile strength, and a lower coefficient of thermal expansion than the given material disposed about the cup-shaped member, and both the collar and cup-shaped member being crimped about that end of the flexible lead disposed within the cup-shaped member.

3. The semiconductor device of claim 1 in which the collar consists of steel.

No references cited.

LEWIS H. MYERS, *Primary Examiner.*

DARRELL L. CLAY, *Examiner.*